(12) United States Patent
Kadota (10) Patent No.: US 7,881,397 B2
(45) Date of Patent: Feb. 1, 2011

(54) WIRELESS COMMUNICATION SYSTEM

(75) Inventor: Toshihide Kadota, Poway, CA (US)

(73) Assignee: Teradyne, Inc., North Reading, MA (US)

( * ) Notice: Subject to any disclaimer, the term of this patent is extended or adjusted under 35 U.S.C. 154(b) by 829 days.

(21) Appl. No.: 11/094,900

(22) Filed: Mar. 31, 2005

(65) Prior Publication Data

US 2006/0222102 A1 Oct. 5, 2006

(51) Int. Cl.
*H04L 27/00* (2006.01)

(52) U.S. Cl. .................. 375/295; 327/100; 327/172; 327/31; 332/112; 329/311; 329/312; 329/313; 370/205

(58) Field of Classification Search .............. 375/295; 327/100, 172, 31; 332/112; 329/311, 312, 329/313; 370/205, 112
See application file for complete search history.

(56) References Cited

U.S. PATENT DOCUMENTS

| | | | | |
|---|---|---|---|---|
| 5,784,413 | A * | 7/1998 | Chen | 375/308 |
| 7,158,580 | B1 * | 1/2007 | Albulet | 375/285 |
| 2001/0031023 | A1 * | 10/2001 | Lye et al. | 375/329 |
| 2002/0163962 | A1 * | 11/2002 | Al-Eidan | 375/240 |
| 2005/0003785 | A1 * | 1/2005 | Jackson et al. | 455/260 |
| 2005/0063490 | A1 * | 3/2005 | Grewing et al. | 375/322 |
| 2005/0089115 | A1 * | 4/2005 | Hartmann et al. | 375/285 |

FOREIGN PATENT DOCUMENTS

WO  WO03/058833  7/2003

OTHER PUBLICATIONS

Kazimierz et al., "Ultra-Wideband Radio Technology", John Wiley & Sons, Ltd., pp. 44-53 (2004).
Kazimierz et al., "Ultra-Wideband Radio Technology", John Wiley & Sons, Ltd., pp. 55-87 (2004).
Holma et al., "WCDMA For Units", John Wiley & Sons, Ltd., pp. 69-86 (2002).
Heyman et al., "Ultra-Wideband Short-Pulse Electromagnetics 4", Kluwer Academic/Plenum Publishers, pp. 157-164 (1999).
Heyman et al., "Ultra-Wideband Short-Pulse Electromagnetics 4", Kluwer Academic/Plenum Publishers, pp. 195-202 (1999).
Seurre et al., "RF Physical Layer", EDGE for Mobile Internet, pp. 69-108 (2003).

* cited by examiner

*Primary Examiner*—David C Payne
*Assistant Examiner*—Zewdu Kassa
(74) *Attorney, Agent, or Firm*—Fish & Richardson P.C.

(57) ABSTRACT

Methods and systems for modulating a signal are described. A phase-modulated signal that includes a sequence of contiguous one-cycle sinusoidal waveforms having a frequency above 50 MHz is generated. The phases of the one-cycle sinusoidal waveforms correspond to symbols of a message signal. A bandwidth of the phase-modulated signal is reduced using a bandpass filter centered at the frequency of the contiguous one-cycle sinusoidal waveforms. The phase-modulated signal is wirelessly transmitted.

6 Claims, 8 Drawing Sheets

(Prior Art)

FIG. 5b

WIRELESS COMMUNICATION SYSTEM

TECHNICAL FIELD

This disclosure relates to wireless communication systems, and more particularly to signal modulation and demodulation techniques.

BACKGROUND

Many conventional wireless communication systems use heterodyning techniques for transmitting and receiving signals. Heterodyning techniques involve multiplying or mixing an information-carrying signal (referred to as a message signal) with a purely sinusoidal signal (referred to as a carrier) to produce an output signal having a frequency translated by an amount equal to the frequency of the carrier (referred to as the carrier frequency). For example, a heterodyne transceiver may be used to modulate a base-band message signal to a radio frequency (RF) and demodulate an RF-modulated signal to baseband. A heterodyne transceiver may apply one or more filters and amplifiers to an RF-modulated signal before either transmitting the signal through air or demodulating the signal to baseband. A baseband signal may be formed using orthogonal frequency-division multiplexing (OFDM) in which multiple message signals are modulated to orthogonal frequency bands and added together. The message signals may be modulated using a variety of modulation techniques, examples of which include amplitude modulation (AM) and frequency modulation (FM). OFDM allows multiple message signals to be modulated to RF and transmitted simultaneously.

A carrier with a stable frequency is produced by a local oscillator. A local oscillator uses negative feedback to adjust the frequency of the carrier. A local oscillator may include analog circuitry, digital circuitry, or a combination of analog and digital circuitry. A local oscillator may include a direct digital synthesizer (DDS), which is a digital component that generates a frequency- and phase-tunable sinusoidal signal that is referenced to a fixed-frequency clock. In some DDS devices, the frequency and phase of the output signal is programmable and may be adjusted while the DDS is in operation. Most DDS devices include a phase accumulator, a waveform lookup table, and a digital-to-analog converter (DAC). The DDS may include phase and frequency registers or RAM for generating various modulation schemes. The DDS may also include a comparator for generating a clock signal from its sinusoidal output.

SUMMARY

The invention provides methods and systems for producing a modulated signal.

In general, in one aspect, the invention features a method directed to generating a phase-modulated signal comprising a sequence of contiguous one-cycle sinusoidal waveforms having a frequency above 50 MHz. The phases of the one-cycle sinusoidal waveforms correspond to symbols of a message signal. A bandwidth of the phase-modulated signal is reduced using a bandpass filter centered at the frequency of the contiguous one-cycle sinusoidal waveforms. The phase-modulated signal is wirelessly transmitted. This aspect may include one or more of the following.

A second phase-modulated signal comprising a second sequence of contiguous one-cycle sinusoidal waveforms. A second message signal may be recovered by determining a phase of each of the contiguous one-cycle sinusoidal waveforms of the second phase-modulated signal. The direct digital synthesizer may be programmed to generate a one-cycle sinusoidal waveform having a first phase if a corresponding symbol of the message signal is a binary zero. The direct digital synthesizer may be programmed to generate a one-cycle sinusoidal waveform having a second phase offset by 180 degrees from the first phase if the corresponding symbol of the message signal is a binary one. First and second samples from each of the contiguous one-cycle sinusoidal waveforms of the second phase-modulated signal may be collected at respective first and second sampling times occurring when the second phase-modulated signal is monotonic. The phase may be determined by calculating a difference between the first and second samples and determining whether the difference is a positive or negative value. The phase-modulated signal may be wirelessly translated at a data speed equal to the frequency of the contiguous one-cycle sinusoidal waveforms.

In general, in another aspect, the invention features a method directed to generating a phase-modulated signal that includes a sequence of contiguous one-cycle sinusoidal waveforms having a frequency below a predetermined value, that may be approximately 500 MHz. Phases of the contiguous one-cycle sinusoidal waveforms correspond to symbols of a message signal. The phase-modulated signal is mixed with a sinusoidal carrier having a frequency greater than the predetermined value to produce a radio-frequency modulated signal. The bandwidth of the radio-frequency modulated signal is reduced using a bandpass filter centered at the frequency of the sinusoidal carrier. The radio-frequency modulated signal is wirelessly transmitted. This aspect may include one or more of the following.

A second radio-frequency modulated signal may be received and mixed with a sinusoidal signal having a frequency equal to the frequency of a second sinusoidal carrier to recover the second phase-modulated signal. The second phase-modulated signal may include a second sequence of contiguous one-cycle sinusoidal waveforms. A second message signal may be recovered by determining a phase of each of the contiguous one-cycle sinusoidal waveforms of the second phase-modulated signal. First and second samples from each of the contiguous one-cycle sinusoidal waveforms of the second phase-modulated signal may be collected at respective first and second sampling times occurring when the second phase-modulated signal is monotonic. The phase may be determined by calculating a difference between the first and second samples and determining whether the difference is a positive or negative value. A direct digital synthesizer may be programmed to generate first and second contiguous one-cycle sinusoidal waveforms having first and second phases representing first and second symbols of the message signal.

In general in another aspect, the invention features a system that includes a programmable direct digital synthesizer configured to generate a phase-modulated signal that includes a sequence of contiguous one-cycle sinusoidal waveforms having a frequency above 50 MHz. The phases of the contiguous one-cycle sinusoidal waveforms correspond to symbols of a message signal. A bandpass filter centered at the frequency of the contiguous one-cycle sinusoidal waveforms is configured to reduce the bandwidth of the phase-modulated signal. An antenna wirelessly transmits the phase-modulated signal. This aspect may include one or more of the following.

An edge detector may be provided to recover a second message signal from a second phase-modulated signal comprising a second sequence of contiguous one-cycle sinusoidal waveforms by determining a phase for each of the contiguous one-cycle sinusoidal waveforms of the second phase-modulated signal. The edge detector may include a sample and hold circuit configured to collect first and second samples from each of the one-cycle sinusoidal waveforms of the second phase-modulated signal at respective first and second sampling times. The sampling times may occur when the second phase-modulated signal is monotonic and the second sampling time may occur later than the first sampling time. A difference between the first and second samples is calculated the phase is determined based on whether the difference is a positive or negative value. The antenna may include at least one of: a patch antenna, a microstrip antenna, a helical antenna, and an array of multiple antennas. The programmable direct digital synthesizer may include a waveform lookup table, an accumulator, and an analog-to-digital converter. The waveform lookup table may include a read-only memory configured to store incremental arguments of a sinusoidal waveform and to output a value stored at an address of the waveform lookup table. The accumulator may include a counter to increment a stored number, corresponding to the address of the waveform lookup table, by an incremental amount determined by a program for generating the phase-modulated signal. The analog-to-digital converter may convert a digital signal produced by the waveform lookup table to an analog signal.

In general in another aspect, the invention features a system that includes a programmable direct digital synthesizer configured to generate a phase-modulated signal comprising a sequence of contiguous one-cycle sinusoidal waveforms having a frequency below a predetermined value, which may be approximately 500 MHz. The phases of the contiguous one-cycle sinusoidal waveforms may correspond to symbols of a message signal. A mixer may be provided to mix the phase-modulated signal with a sinusoidal carrier having a frequency greater than the predetermined value to produce a radio-frequency modulated signal. A bandpass filter centered at the frequency of the contiguous one-cycle sinusoidal waveforms may be provided to reduce the bandwidth of the radio-frequency modulated signal. An antenna is provided for wirelessly transmitting the phase-modulated signal to a receiver. A second mixer configured to mix a second radio-frequency modulated signal with a sinusoidal signal having a frequency equal to a frequency of a second sinusoidal carrier may be provided to recover a second phase-modulated signal. The second phase-modulated signal may include a second sequence of contiguous one-cycle sinusoidal waveforms. An edge detector may be provided to recover a second message signal from the second phase-modulated signal by determining a phase for each of the contiguous one-cycle sinusoidal waveforms of the second phase-modulated signal. The edge detector may include a sample and hold circuit configured to collect first and second samples from each of the contiguous one-cycle sinusoidal waveforms of the second phase-modulated signal at respective first and second sampling times. The sampling times may occur when the second phase-modulated signal is monotonic and the second sampling time may occur later than the first sampling time. A difference between the first and second samples is calculated the phase is determined based on whether the difference is a positive or negative value. The programmable direct digital synthesizer may include a waveform lookup table, an accumulator, and an analog-to-digital converter. The waveform lookup table may include a read-only memory configured to store incremental arguments of a sinusoidal waveform and to output a value stored at an address of the waveform lookup table. The accumulator may include a counter to increment a stored number, corresponding to the address of the waveform lookup table, by an incremental amount determined by a program for generating the phase-modulated signal. The analog-to-digital converter may convert a digital signal produced by the waveform lookup table to an analog signal.

Advantages that can be seen in particular implementations of the invention include one or more of the following. A message signal may be directly modulated to a radio frequency. Transceiver circuitry may be simplified without sacrificing the data speed of the modulated signal. The circuit impedance may be controlled at the design stage with known shaped-filtering techniques. The frequency and phase of the modulated signal may be programmably adjusted. A modulated signal produced by a particular implementation of the invention may have a wider bandwidth and a higher data speed than a modulated signal produced using conventional heterodyning techniques.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1b shows a modulated output signal produced by the wireless communication system of FIG. 1a.

FIG. 4b shows a frequency spectrum of the modulated signal in FIG. 4a.

FIG. 5b shows the frequency spectrum of an exemplary modulated signal produced by the wireless communication system of FIG. 5a.

DETAILED DESCRIPTION

Figure 1A:
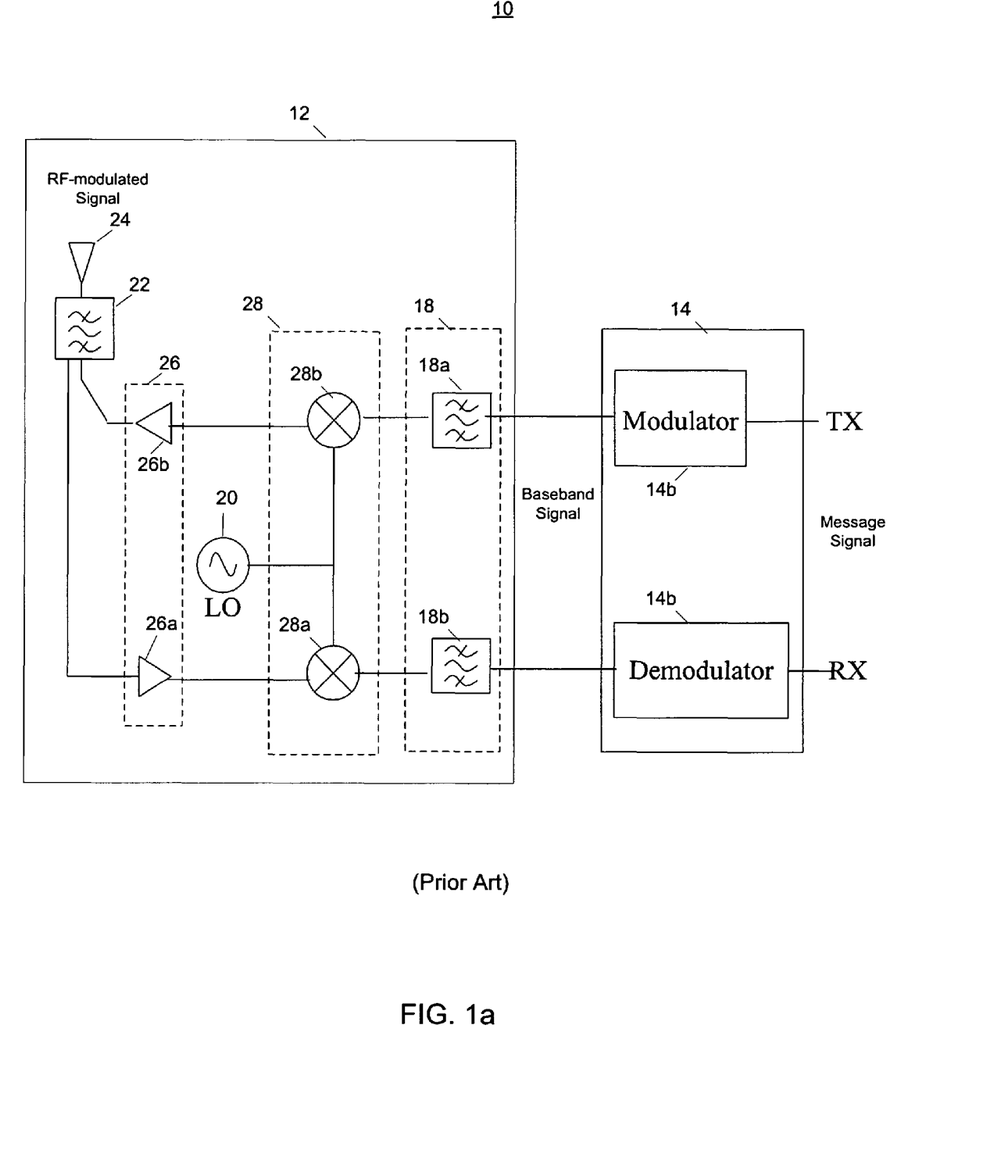
FIG. 1a is a block diagram of an existing wireless communication system.

Referring to FIG. 1, an existing wireless communication system 10 includes an antenna 24 for sending and receiving radio frequency (RF)-modulated signals, a heterodyne transceiver 12 for demodulating RF signals to baseband and modulating baseband signals to RF, and an intermediate frequency (IF) stage 14 for modulating message signals to form baseband signals and demodulating baseband signals to recover message signals. A message signal carries information and may be, for example, a string of bits. A message signal may also include hexadecimal numbers, decimal numbers, and symbols. The message signal is used to encode information that may include, for example, audio data, video data, text, files, and other types of information.

Modulator 14b in IF stage 14 modulates multiple message signals to different intermediate frequencies and then adds the modulated message signals (referred to as channels) together to produce a baseband signal. Modulator 14b may include multiple modulators that perform a variety of modulation techniques. Examples of such modulation techniques include, for example, single-sideband, double-sideband, vestigial-sideband, phase, frequency, angle, and amplitude modulation. Modulator 14b may modulate the message signals to different intermediate frequencies by mixing the message signals with IF-carriers (referred to as subcarriers). The bandwidths of the channels may be limited by passing them through one or more bandpass filters. The subcarriers and the bandpass filters may be chosen such that the channels are orthogonal (i.e., the frequency spectrums of the channels do not overlap). Empty spectral bands (referred to as guardbands) may be inserted between the channels to help prevent channel cross-talk. Heterodyne transceiver 12 modulates the baseband signal to RF before transmitting it through air.

Heterodyne transceiver 12 includes a local oscillator 20, mixers 28a and 28b (collectively referred to as mixers 28), amplifiers 26a and 26b (collectively referred to as amplifiers 26), IF-centered bandpass filters 18a and 18b (collectively referred to as bandpass filters 18), RF-centered bandpass filter 22, and antenna 24.

The baseband signal may be filtered by passband filter 18a and amplified in IF stage 14 before entering mixer 28b of heterodyne transceiver 12. Mixers 28 mix the baseband signal with an RF carrier produced by local oscillator 20. Mixers 28 include multiplier circuitry for multiplying signals together and may be implemented with analog circuitry, digital circuitry, or a combination thereof. Mixers 28 may also include a clock input for synchronizing its output to an external clock signal. The output of mixer 28b is an RF-modulated signal that contains the information of the original message signals and is centered at the RF carrier frequency. Adjustable-gain amplifier 26b and bandpass filter 22 may be used to amplify the RF-modulated signal and to fine-tune its bandwidth before the signal is transmitted through air by antenna 24. Antenna 24 may be any kind of antenna including a patch antenna, a helical antenna, a microstrip antenna, a horn antenna, and an array of multiple antennas.

Wireless communication system 10 may be used to demodulate RF-modulated signals. Antenna 24 receives an RF-modulated signal and passes the signal through bandpass filter 22 to remove noise, image signals, and other unwanted signals. Amplifier 26a amplifies the RF-modulated signal before it enters mixer 28a. The amplitude of the RF-modulated signal may be adjusted to provide a sufficient signal to noise ratio without saturating mixer 28a. The RF-modulated signal enters one port of mixer 28a and a signal generated by local oscillator 20 enters another port of mixer 28a. The sinusoidal signal produced by local oscillator 20 is tuned to the RF carrier frequency of the RF-modulated signal. Local oscillator 20 may be implemented with analog circuitry, digital circuitry, or a combination thereof. Local oscillator 20 may include a phase-locked loop and a variable frequency oscillator that produces sinusoidal signals of stable, yet adjustable, frequencies. The variable frequency oscillator may be tuned, for example, by altering a setting on a variable capacitor. Local oscillator 20 may include a direct digital synthesizer (DDS) which produces a sinusoidal output whose frequency and phase may be programmed electronically.

Mixer 28a mixes the RF-modulated signal and the local oscillator output to produce the original baseband signal. In addition to the baseband signal, the output of mixer 28a may also include unwanted image signals. Bandpass filter 18b filters unwanted image signals from the output of mixer 28a to recover the baseband signal. Passband filters 18 and 22 may consist simply of LC tuned transformers, high performance ceramic- or crystal-based filters, or surface acoustic wave filters. Passband filters 18 and 22 may be implemented in digital hardware, analog circuitry, or a combination thereof. Passband filters 18 and 22 may also have a finite-impulse response (FIR) and zero phase. As described above, the baseband signal contains several orthogonal channels. IF stage 14 includes filters and amplifiers for separating the channels contained within the baseband signal. After the channels have been separated, they are demodulated using demodulator 14a. Demodulator 14a may include multiple demodulators that perform different types of demodulation. The output signals from demodulator 14a are the recovered message signals.

Figure 1B:
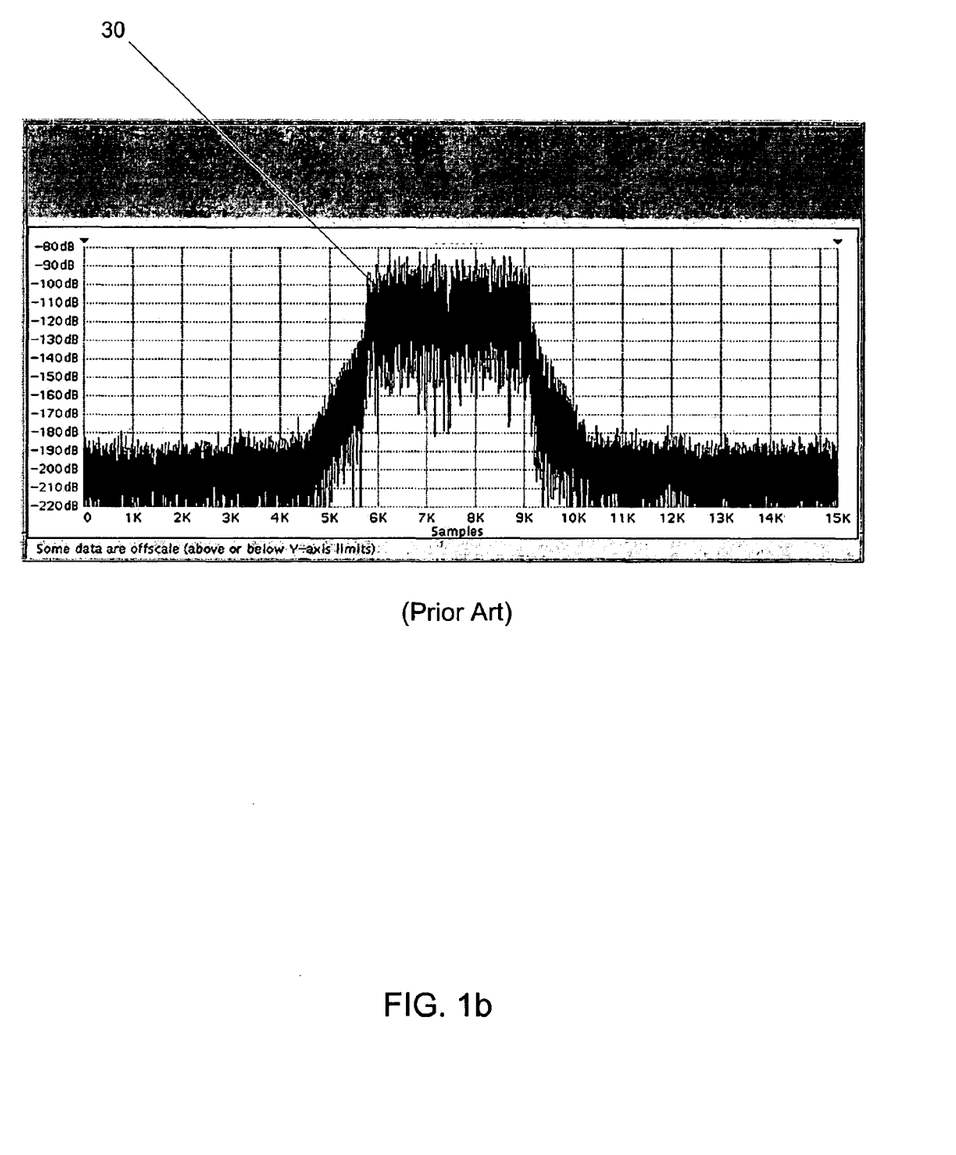

FIG. 1b shows an example of a modulated signal 30 produced by system 10. In this example, the RF carrier frequency produced by mixer 28b may be approximately either 2.4 GHz or 5.2 GHz. The baseband signal has a bandwidth of approximately 20 MHz and holds 48 channels. A portion of the baseband signal also includes guardbands and pilot tones. Each channel carries 6 bits of information; therefore, the entire baseband signal holds 288 bits. The individual bandwidths of the channels may be reduced by applying ¾ rate coding to the channels. After the ¾ rate coding is applied, the entire baseband signal holds 216 bits. The baseband is generated, modulated to an RF carrier frequency, and transmitted within a time interval of approximately 4 us. In this example, system 10 may transmit information at a maximum data speed of approximately 54 Mbps (i.e. 216 bits/4 μs).

Figure 2:
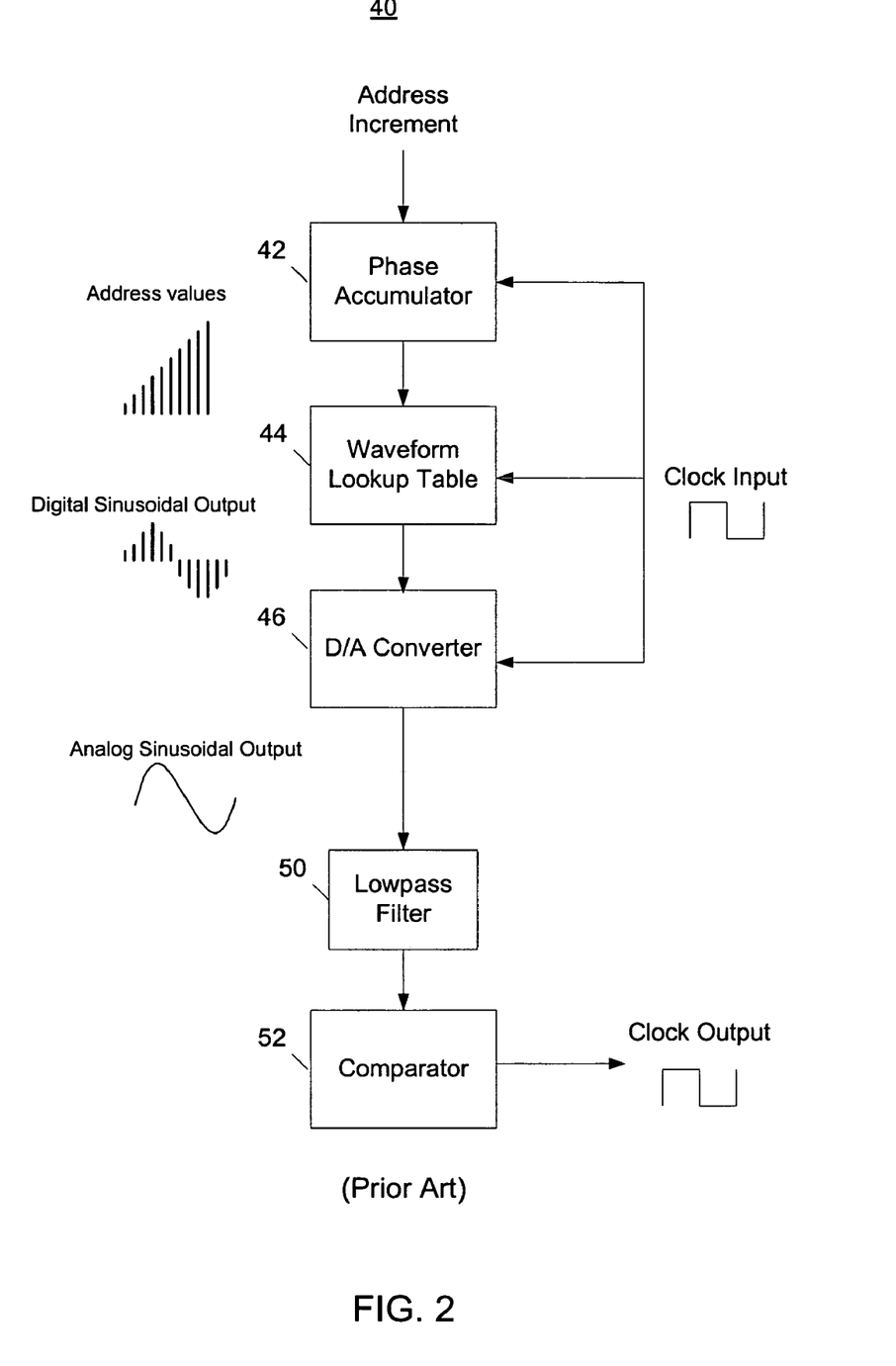
FIG. 2 is a block diagram of a direct digital synthesizer (DDS).

Referring to FIG. 2, an example of an existing DDS 40 is shown. DDS 40 includes phase accumulator 42, waveform lookup table 44, analog-to-digital converter (DAC) 46, low-pass filter 50, and comparator 52.

Waveform lookup table 44 stores uniformly spaced samples of one waveform cycle in read-only memory (ROM). When an address value is input to lookup table 44, the value stored at that address is expressed. Thus, by sampling lookup table 44 repeatedly at uniform address increments, a periodic or sinusoidal waveform may be generated. The samples in lookup table 44 represent a single cycle of length $N=2^B$, where B is the number of bits per sample and N is the number of samples. Lookup table 44 has N memory addresses that each hold a sample value equal to the sine or the cosine of an integral multiple k of an argument given by $k*(2\pi/N)$, where $k=0, 1, 2, \ldots, N-1$. For example, if N is equal to 4, lookup table 44 would have four memory addresses containing the values: $\sin(0)$, $\sin(2\pi/4)$, $\sin(4\pi/4)$, and $\sin(3\pi/4)$.

After every clock cycle, lookup table 44 receives an address of a stored sample from phase accumulator 42. Lookup table 44 then outputs the sample value held at that address. The frequency of the output waveform depends on the clock frequency, the cycle length N, and the address increment which corresponds to accessing samples stored in every $k^{th}$ address. For example, if lookup table 44 includes $2^5=32$ (5-bit) samples of a sine wave and if the address increment is set to one, the synthesizer may calculate the sine function for the phase angles: $0$, $2\pi/32$, $2(2\pi/32)$, $3(2\pi/32), \ldots, 31(2\pi/32)$, creating a waveform that contains all the samples stored in the lookup table. Furthermore, if only every other sample is accessed, then a sinusoid with twice the frequency of the original waveform is produced. As the address increment increases, the frequency of the output waveform increases. As the output frequency is increased, the number of samples per sinusoid decreases. According to the Nyquist sampling theory, at least two samples per cycle are required to reconstruct the output waveform; therefore, the maximum output frequency that may be produced by DDS 40 is equal to half of the frequency of the reference clock. However, for practical applications, the output frequency may be less than the maximum to improve the quality of the reconstructed waveform and permit filtering on the output. The maximum output frequencies of existing off-the-shelf DDS devices range between approximately 50 MHz and 1.2 GHz; however, as DDS technology advances, the output frequency of a DDS is expected to reach approximately 5 GHz or higher. For example, the output frequency of a DDS may reach 50 GHz at optical sampling diode frequencies.

Phase accumulator 42 increments a stored number by an incremental amount (referred to as an address increment) every time it receives a clock pulse and then outputs the sum to lookup table 44. Phase accumulator 42 counts from 0 to N by an increment equal to the address increment, repeating the count from zero when the sum reaches or exceeds N. The output from phase accumulator 42 serves as the address input into lookup table 44. Accumulator 42 may include an adder for summing address increments and a register for storing the sum.

The output of lookup table 44 is fed into DAC 46 which converts the digital sinusoidal output of lookup table 44 to an analog sinusoidal output. The analog sinusoidal output may be converted to a square-wave output using lowpass filter 50 and comparator 52. The square-wave output may be used as an input clock by other devices.

Figure 3:
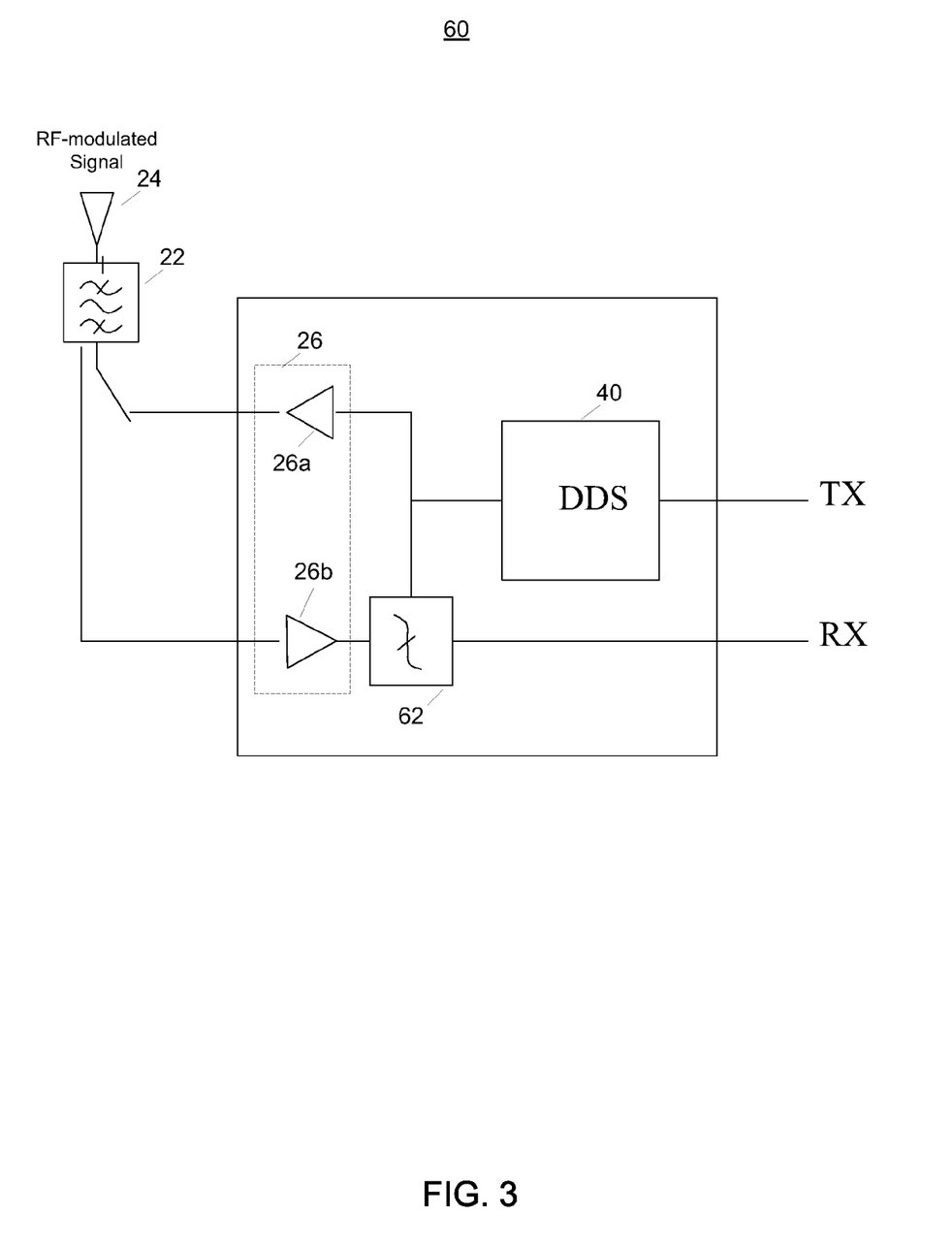
FIG. 3 is a block diagram of a wireless communication system that includes the DDS shown in FIG. 2.

Referring to FIG. 3, a wireless communications system 60 for directly modulating and demodulating a message signal is shown. Communication system 60 includes DDS 40, edge detector 62, amplifiers 26, RF-centered bandpass filter 22, and antenna 24. DDS 40 generates a directly modulated signal, for example, a phase-modulated signal composed of a sequence of contiguous one-cycle sinusoidal waveforms. The phases of the one-cycle sinusoidal waveforms correspond to bits of a message signal. For example, "zero" and "one" bits of a binary message signal may be mapped to phases of zero and 180 degrees. In this example, a message signal "0101" would be encoded as a phase-modulated signal in which the phases of the first, second, third, and fourth sinusoidal waveforms are zero degrees, 180 degrees, zero degrees, and 180 degrees, respectively. The carrier frequency of the phase-modulated signal is equal to the frequency of the one-cycle sinusoidal waveforms. The carrier frequency may be 50 MHz or higher, for example between 100 MHz and 16 GHz. The phase-modulated signal produced by DDS 40 may be amplified using amplifier 26a, which may be an adjustable-gain amplifier.

Figure 4A:
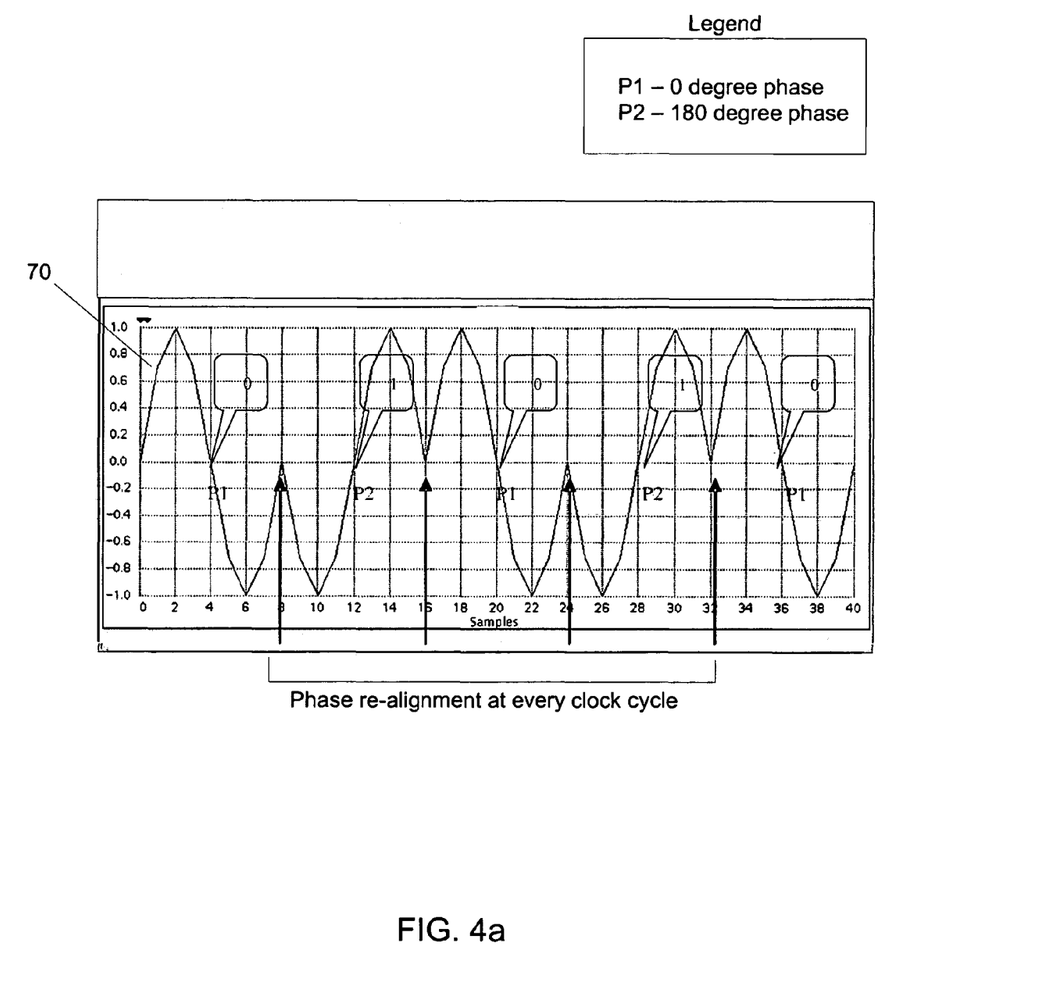
FIG. 4a shows an exemplary modulated signal produced by the wireless communication system shown in FIG. 3.
Figure 4B:
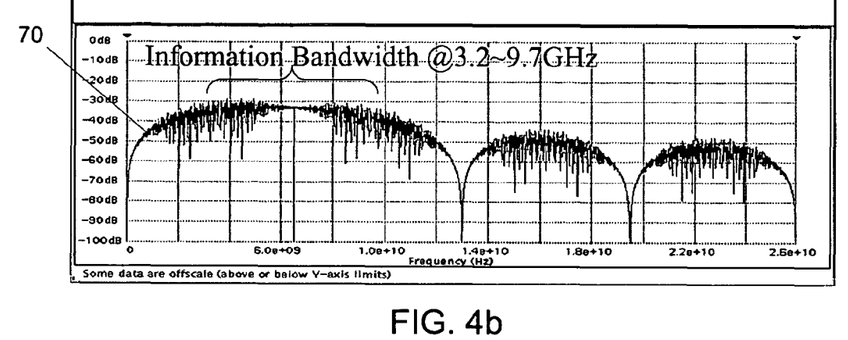
Figure 4C:
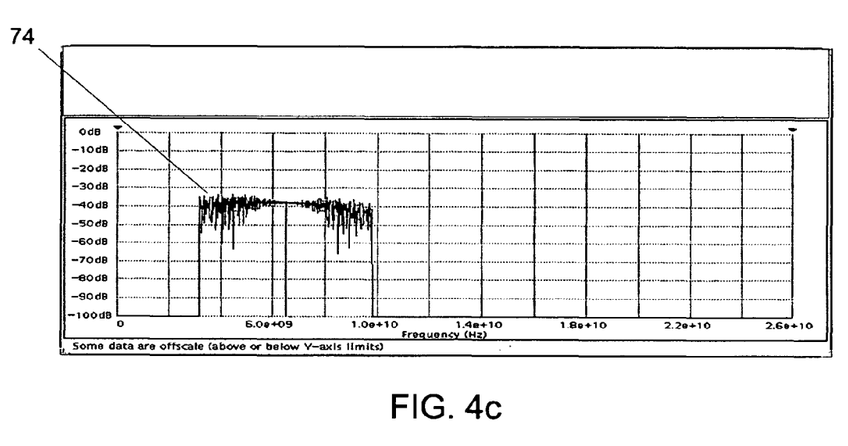
FIG. 4c shows a frequency spectrum of a filtered signal produced by passing the modulated signal in FIG. 4b through a bandpass filter.

An example of a phase-modulated signal produced by DDS 40 is shown in FIGS. 4a-c. FIG. 4a shows a portion of the modulated signal 70 in the time-domain. The modulated signal is composed of a series of one-cycle sinusoids that have a length of 8 samples and a phase of either zero or 180 degrees. The carrier frequency (i.e., the frequency of each one-cycle sinusoid, is approximately 6.48 GHz. After every 8 samples, the phase of the signal is re-aligned according to the value of a corresponding bit in the message signal. In this example, the phase of the signal is set to zero if the corresponding bit is a "zero" and to 180 degrees if the corresponding bit is a "one." Phase accumulator 42 (FIG. 2) of DDS 40 may be programmed to count upward one full cycle of a sinusoid waveform when the message signal contains a "zero" to produces a zero-phase sinusoidal waveform. When the message signal contains a "one", the phase accumulator may be programmed to count backward one full cycle to produce a sinusoidal waveform that is shifted by 180 degrees.

FIG. 4b shows the modulated signal 70 in the frequency domain. The frequency spectrum of modulated signal 70 ranges between zero and 26 GHz. The bandwidth of modulated signal 70 is reduced by passing the signal through RF-centered bandpass filter 22. Bandpass filter 22 may be a zero-phase FIR filter that does not significantly distort the phase of the modulated signal.

FIG. 4c shows filtered signal 74 in the frequency domain. Filtered signal 74 is produced by filtering modulated signal 70 using a zero-phase bandpass filter with a center frequency at approximately 6.48 GHz and a passband of approximately 6.5 GHz. Filtered signal 74 has a bandwidth of approximately 6.5 GHz.

Figure 4D:
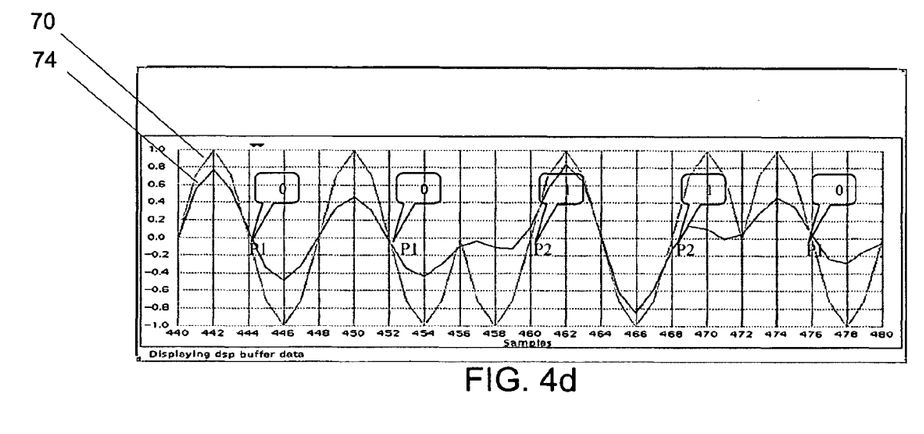
FIG. 4d shows the filtered signal of FIG. 4c in the time-domain.

FIG. 4d shows filtered signal 74 in the time-domain. Although the amplitude of modulated signal 70 has been distorted by the filtering, the phase of modulated signal 70 has been preserved at P1 and P2. The information held in the phases at P1 and P2 may be completely recovered from filtered signal 74.

A directly modulated signal produced by system 60 may have a wider bandwidth and a higher data speed than a modulated signal produced by system 10. In contrast to system 10, the data speed of a directly modulated signal produced by system 60 (FIG. 3) may be as high as the carrier frequency. For example, as shown in FIGS. 4a-c, the data speed of modulated signal 70 may be as high as 6.48 Gbps (the carrier frequency).

Wireless communication system 60 may be used to demodulate signals that have been directly modulated using system 60. A modulated signal is received by antenna 24 and may be passed through bandpass filter 22 that filters out unwanted signals such as noise. The signals may be amplified by amplifier 26b and directly demodulated using edge detector 62. Edge detector 62 may be synchronized to the clock output of DDS 40 so that at every clock cycle, edge detector 62 samples the output of amplifier 26b. Edge detector 62 determines whether the phase of the signal over a clock cycle is zero degrees or 180 degrees. Depending on the outcome, edge detector 62 transmits a "one" or a "zero." Edge detector 62 may include a sample and hold circuit that collects two consecutive samples at a time when the signal is monotonically increasing or decreasing (e.g., at times P1 and P2). Edge detector 62 calculates the difference between the first and second samples. If the difference between the samples is a positive value, edge detector 62 determines that the phase of the cycle is zero degrees and transmits a "zero" bit. If the difference between the samples is a negative value, edge detector 62 determines that the phase of the cycle is 180 degrees and transmits a "one" bit.

Figure 5A:
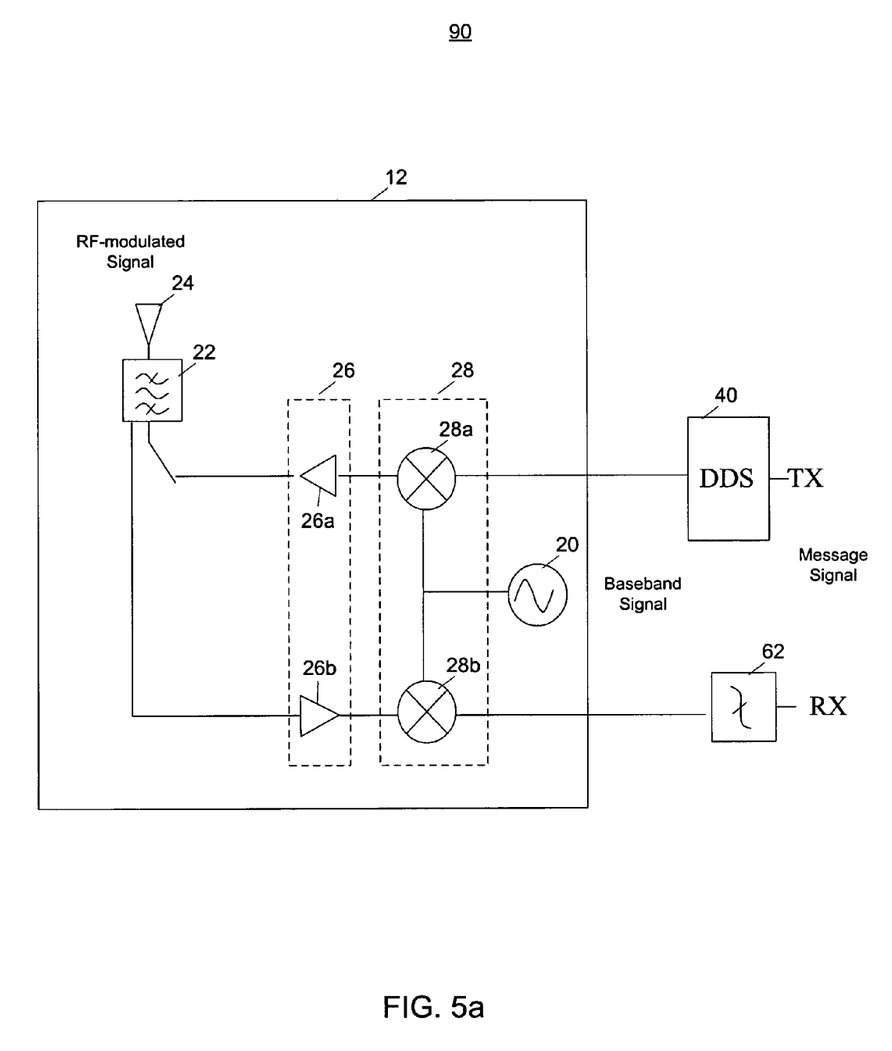
FIG. 5a is a block diagram of another wireless communication system that includes the DDS shown in FIG. 2.

FIG. 5a shows a wireless communication system 90 in which a message signal is modulated to an intermediate frequency by DDS 40 and then subsequently modulated to RF by heterodyne transceiver 12. Wireless communication system 90 includes DDS 40, edge detector 62, local oscillator 20, mixers 28, amplifiers 26, bandpass filter 22, and antenna 24. Local oscillator 20, mixers 28, amplifiers 26, bandpass filter 22, and antenna 24 perform the same or similar functions as in the wireless communication system 10 shown in FIG. 1a. DDS 40 generates a phase-modulated signal composed of a sequence of contiguous one-cycle sinusoidal waveforms akin to the phase-modulated signal shown in FIG. 4a. The frequency of the one-cycle sinusoidal waveforms may range between approximately 50 MHz and 16 GHz, for example the frequency may be approximately 500 MHz, 3.1 GHz, or 10.6 GHz. The phase-modulated signal is modulated to an RF frequency by mixer 28a that mixes the signal with an RF carrier produced by local oscillator 20. The RF-modulated signal may be amplified by amplifier 26a and filtered by bandpass filter 22 before being transmitted by antenna 24.

Wireless communication system 90 may also be used to demodulate a signal that has been modulated by system 90. An RF-modulated signal is received by antenna 24, filtered by bandpass filter 22, and amplified by amplifier 26*b*. Mixer 28*b* mixes the RF-modulated signal with an RF signal produced by local oscillator 20 to recover the phase-modulated signal. Edge detector 62 determines whether the phase of the signal over a clock cycle is zero degrees or 180 degrees and sends a bit corresponding to the determined phase.

Figure 5B:
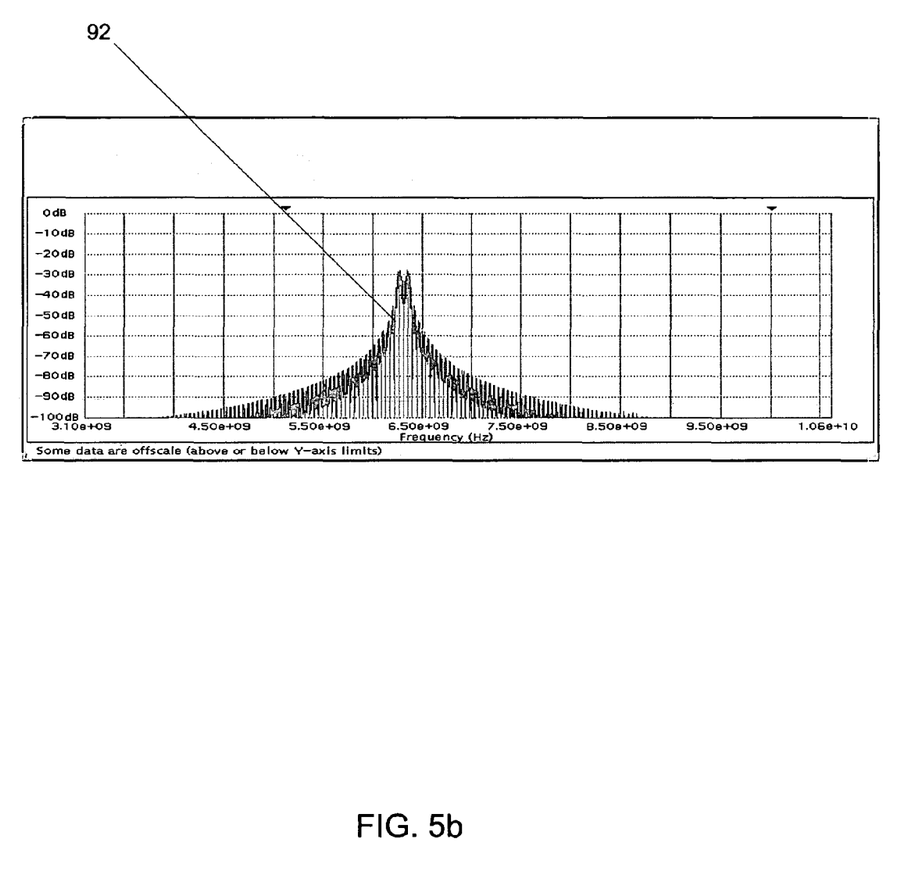

An example of an RF-modulated signal 92 produced by wireless communication system 90 is shown in FIG. 5*b*. Signal 92 has a bandwidth of approximately 4.5 GHz and is centered at approximately 6.48 GHz. The data speed of signal 92 is proportional to the bandwidth and may be as high as approximately 4.5 Gbps.

Wireless communication systems 60 and 90 are not limited to use with the hardware and software described herein. Systems 60 and 90 can be implemented in digital electronic circuitry, or in computer hardware, firmware, software, or in combinations thereof.

Systems 60 and 90 can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one direct digital synthesizer or on multiple direct digital synthesizers at one site or distributed across multiple sites and interconnected by a communication network.

Method steps associated with systems 60 and 90 can be performed by one or more programmable processors executing one or more computer programs to perform the functions of the processes. All or part of systems 60 and 90 can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

The circuitry described herein, including DDS 40, mixers 28, bandpass filters 18 and 22, amplifiers 26, local oscillator 20, and antenna 24, may be implemented as part of systems 60 and 90 or as separate circuitry for use in conjunction with systems 60 and 90.

A number of embodiments of the invention have been described. Nevertheless, it will be understood that various modifications may be made without departing from the spirit and scope of the invention. For example, the phase of a sinusoidal waveform generated by DDS 40 may correspond to a symbol that contains multiple bits of a message signal. For example, phase values of zero, 90 degrees, 180 degrees, and 270 degrees may correspond to symbols "00", "01", "10", and "11." Accordingly, other embodiments are within the scope of the following claims.

What is claimed is:

1. A method comprising:
   directly generating a phase-modulated signal using a direct digital synthesizer (DDS), the phase-modulated signal comprising a sequence of contiguous one-cycle sinusoidal waveforms having a frequency above 50 MHz and a carrier frequency above 50 MHz, wherein phases of the one-cycle sinusoidal waveforms correspond to symbols of a message signal, and wherein the carrier frequency of the phase-modulated signal is equal to the frequency of the one-cycle waveforms;
   reducing a bandwidth of the phase-modulated signal using a bandpass filter centered at the frequency of the contiguous one-cycle sinusoidal waveforms;
   wirelessly transmitting the phase-modulated signal;
   receiving a second phase-modulated signal comprising a second sequence of contiguous one-cycle sinusoidal waveforms;
   determining a phase of each of the contiguous one-cycle sinusoidal waveforms of the second phase-modulated signal to recover a second message signal; and
   wherein determining the phase comprises:
      collecting first and second samples from each of the contiguous one-cycle sinusoidal waveforms of the second phase-modulated signal at respective first and second sampling times occurring when the second phase-modulated signal is monotonic, the second sampling time occurring later than the first sampling time;
      calculating a difference between the first and second samples; and
      determining the phase based on whether the difference is a positive or negative value.

2. The method of claim 1, wherein generating the phase-modulated signal comprises:
   programming a direct digital synthesizer to generate a one-cycle sinusoidal waveform having a first phase if a corresponding symbol of the message signal is a binary zero; and
   programming the direct digital synthesizer to generate a one-cycle sinusoidal waveform having a second phase offset by 180 degrees from the first phase if the corresponding symbol of the message signal is a binary one.

3. The method of claim 1, wherein wirelessly transmitting the phase-modulated signal comprises transmitting the phase-modulated signal at a data speed equal to the frequency of the contiguous one-cycle sinusoidal waveforms.

4. A system comprising:
   a programmable direct digital synthesizer configured to directly generate a phase-modulated signal comprising a sequence of contiguous one-cycle sinusoidal waveforms having a frequency above 50 MHz and a carrier frequency above 50 MHz, wherein phases of the contiguous one-cycle sinusoidal waveforms correspond to symbols of a message signal, and wherein the carrier frequency of the phase-modulated signal is equal to the frequency of the one-cycle waveforms;
   a bandpass filter centered at the frequency of the contiguous one-cycle sinusoidal waveforms, the bandpass filter configured to reduce the bandwidth of the phase-modulated signal;
   an antenna for wirelessly transmitting the phase-modulated signal;
   an edge detector configured to recover a second message signal from a second phase-modulated signal comprising a second sequence of contiguous one-cycle sinusoidal waveforms by determining a phase for each of the contiguous one-cycle sinusoidal waveforms of the second phase-modulated signal; and
   wherein the edge detector comprises a sample and hold circuit configured to:

collect first and second samples from each of the one-cycle sinusoidal waveforms of the second phase-modulated signal at respective first and second sampling times occurring when the second phase-modulated signal is monotonic, the second sampling time occurring later than the first sampling time;

calculate a difference between the first and second samples; and determine the phase based on whether the difference is a positive or negative value.

5. The system of claim 4, wherein the antenna comprises at least one of: a patch antenna, a microstrip antenna, a helical antenna, and an array of multiple antennas.

6. The system of claim 4, wherein the programmable direct digital synthesizer comprises:

a waveform lookup table comprising read-only memory configured to store incremental arguments of a sinusoidal waveform and to output a value stored at an address of the waveform lookup table;

an accumulator comprising a counter to increment a stored number by an incremental amount, the stored number corresponding to the address of the waveform lookup table and the incremental amount being determined by a program for generating the phase-modulated signal; and a digital-to-analog converter for converting a digital signal produced by the waveform lookup table to an analog signal.

* * * * *